(12) United States Patent
Masuyama

(10) Patent No.: US 9,123,539 B2
(45) Date of Patent: Sep. 1, 2015

(54) METHOD FOR MANUFACTURING OPTICAL SEMICONDUCTOR DEVICE

(71) Applicant: SUMITOMO ELECTRIC INDUSTRIES, LTD., Osaka-shi, Osaka (JP)

(72) Inventor: Ryuji Masuyama, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 318 days.

(21) Appl. No.: 13/734,083

(22) Filed: Jan. 4, 2013

(65) Prior Publication Data
US 2013/0183813 A1   Jul. 18, 2013

(30) Foreign Application Priority Data

Jan. 13, 2012   (JP) .................................. 2012-005473

(51) Int. Cl.
| | |
|---|---|
| *H01L 21/28* | (2006.01) |
| *H01L 21/3205* | (2006.01) |
| *H01L 21/00* | (2006.01) |
| *H01L 21/02* | (2006.01) |
| *H01L 21/3065* | (2006.01) |
| *H01L 21/308* | (2006.01) |
| *H01S 5/22* | (2006.01) |

(52) U.S. Cl.
CPC ...... *H01L 21/02617* (2013.01); *H01L 21/0206* (2013.01); *H01L 21/3065* (2013.01); *H01L 21/3086* (2013.01); *H01S 5/22* (2013.01); *H01S 2304/00* (2013.01)

(58) Field of Classification Search
USPC ............................................. 438/39, 603, 606
See application file for complete search history.

(56) References Cited

U.S. PATENT DOCUMENTS

| 5,616,947 | A | * | 4/1997 | Tamura | .......................... 257/410 |
| 5,762,706 | A | * | 6/1998 | Saito et al. | ..................... 117/105 |
| 2003/0047752 | A1 | | 3/2003 | Campbell et al. | ............. 257/186 |
| 2005/0040413 | A1 | * | 2/2005 | Takahashi et al. | .............. 257/96 |
| 2007/0217459 | A1 | * | 9/2007 | Kishino et al. | ............. 372/43.01 |

FOREIGN PATENT DOCUMENTS

JP   8-306624   11/1996

* cited by examiner

*Primary Examiner* — Karen Kusumakar
(74) *Attorney, Agent, or Firm* — Smith, Gambrell & Russell LLP.

(57) ABSTRACT

A method for manufacturing an optical semiconductor device includes a step of forming a stacked semiconductor layer on a substrate, the stacked semiconductor layer including a plurality of semiconductor layers; a step of forming a mask on a top layer of the stacked semiconductor layer, the mask covering a portion of the top layer; an exposing step of exposing the top layer of the stacked semiconductor layer to an oxygen-containing atmosphere; after the exposing step, a heating step of heating the stacked semiconductor layer to a temperature of 250° C. or more; and after the heating step, a step of forming a semiconductor mesa in the stacked semiconductor layer, the semiconductor mesa being formed by etching the stacked semiconductor layer by a dry etching method using the mask. The top layer of the plurality of semiconductor layers of the stacked semiconductor layer contains arsenic.

8 Claims, 20 Drawing Sheets

METHOD FOR MANUFACTURING OPTICAL SEMICONDUCTOR DEVICE

BACKGROUND OF THE INVENTION

1. Field of the Invention

The present invention relates to a method for manufacturing an optical semiconductor device.

2. Description of the Related Art

Japanese Unexamined Patent Application Publication No. 8-306624 (Patent Literature 1) discloses a method for manufacturing a semiconductor laser having a semiconductor mesa. This manufacturing method includes the steps of preparing a stacked semiconductor layer formed on a semiconductor substrate, covering a portion of a surface of the stacked semiconductor layer with a mask and then etching the stacked semiconductor layer through the mask to form a semiconductor mesa, and forming a buried layer on both sides of the semiconductor mesa. The step of forming a buried layer includes supplying the raw material gases to a rotating susceptor on which the semiconductor substrate is placed. In accordance with such a method for manufacturing a semiconductor laser, a buried layer can be satisfactorily grown on a side surface of a semiconductor mesa.

SUMMARY OF THE INVENTION

In general, as described in Patent Literature 1, the manufacture of an optical semiconductor device having a semiconductor mesa, such as a semiconductor laser, includes forming a stacked semiconductor layer for forming a semiconductor laser on a semiconductor substrate by an epitaxial growth method, such as a metal-organic vapor phase epitaxy (MOVPE) method. A stripe-shaped mask is then formed on a surface of the stacked semiconductor layer to cover a portion of the surface. The stacked semiconductor layer is then dry-etched through the mask, for example, by a reactive ion etching (RIE) method. Through this process, a semiconductor mesa is formed from the stacked semiconductor layer.

When the top layer of a stacked semiconductor layer contains arsenic (As) (for example, an InGaAs layer), however, such a conventional method for manufacturing a semiconductor mesa as described above was found to have the following problems.

In general, the step of forming a mask on a stacked semiconductor layer and the step of dry etching the stacked semiconductor layer through the mask to form a semiconductor mesa of the stacked semiconductor layer are performed with different apparatuses. Thus, the top surface of the stacked semiconductor layer is exposed to an oxygen-containing atmosphere, such as air, between these steps. In this case, it was found that arsenic in the top layer reacted with oxygen ($O_2$) contained in the oxygen-containing atmosphere to form arsenic oxide on the top layer. For example, particulate arsenic oxide is formed on the top layer.

In the presence of arsenic oxide, when the stacked semiconductor layer is dry-etched so as to form a semiconductor mesa, a region of the stacked semiconductor layer covered with the arsenic oxide is difficult to etch. Consequently, a portion of the stacked semiconductor layer under the arsenic oxide is left, for example, as a column in the region from which the stacked semiconductor layer is to be removed by dry etching so as to form a semiconductor mesa.

Such a residual portion may be separated from the stacked semiconductor layer and act as a source of contamination or cause the abnormal growth of a buried layer for burying the semiconductor mesa. Thus, the presence of such a residual portion may decrease the yield of an optical semiconductor device, such as a semiconductor laser. Patent Literature 1 does not describe such a residual portion or a decrease in yield caused by the residual portion.

A method for manufacturing an optical semiconductor device according to one aspect of the present invention includes a step of forming a stacked semiconductor layer on a substrate, the stacked semiconductor layer including a plurality of semiconductor layers; a step of forming a mask on a top layer of the stacked semiconductor layer, the mask covering a portion of the top layer; an exposing step of exposing the top layer of the stacked semiconductor layer to an oxygen-containing atmosphere; after the exposing step, a heating step of heating the stacked semiconductor layer to a temperature of 250° C. or more; and, after the heating step, a step of forming a semiconductor mesa in the stacked semiconductor layer, the semiconductor mesa being formed by etching the stacked semiconductor layer by a dry etching method using the mask. In addition, the top layer of the plurality of semiconductor layers of the stacked semiconductor layer contains arsenic.

In this method, the heating step after the exposing step includes heating the stacked semiconductor layer to a temperature of 250° C. or more. Thus, even when arsenic in the top layer of the stacked semiconductor layer reacts with oxygen in an oxygen-containing atmosphere to form nonuniform arsenic oxide on the top layer in the exposing step, part or all of the arsenic oxide can be removed in the heating step. Thus, when the stacked semiconductor layer is etched by a dry etching method in the step of forming a semiconductor mesa, little portion of the stacked semiconductor layer is left under the arsenic oxide to form a residual portion. This can suppress the decrease in yield due to the residual portion in the manufacture of an optical semiconductor device.

The method for manufacturing an optical semiconductor device may further include a reduced pressure step of maintaining the stacked semiconductor layer under reduced pressure after the exposing step and before the heating step. Preferably, the stacked semiconductor layer is maintained under reduced pressure between the reduced pressure step and the step of forming the semiconductor mesa. This can prevent the formation of arsenic oxide on the top layer of the stacked semiconductor layer between the removal of arsenic oxide from the top layer in the heating step and the dry etching process in the step of forming the semiconductor mesa. This can further suppress the decrease in yield due to the residual portion in the manufacture of an optical semiconductor device.

In the method for manufacturing an optical semiconductor device, the heating step is preferably performed while the stacked semiconductor layer is maintained in a nitrogen atmosphere, an argon atmosphere, or a helium atmosphere. This can prevent the formation of arsenic oxide on the top layer of the stacked semiconductor layer after the removal of arsenic oxide from the top layer in the heating step. This can further suppress the decrease in yield due to the residual portion in the manufacture of an optical semiconductor device.

In the method for manufacturing an optical semiconductor device, in the step of forming the semiconductor mesa, the stacked semiconductor layer may be etched by a reactive ion etching method using a gas containing hydrogen iodide (HI) or a gas containing chlorine. Preferably, the gas containing chlorine is a gas containing at least one of chlorine $Cl_2$, silicon tetrachloride $SiCl_4$, and boron trichloride $BCl_3$.

Arsenic oxide is difficult to etch in dry etching by a reactive ion etching method using a gas containing hydrogen iodide (HI) or a gas containing chlorine. Thus, the presence of arsenic oxide on the top layer of the stacked semiconductor layer immediately before the dry etching step tends to result in the formation of a residual portion of the stacked semiconductor layer under the arsenic oxide after the dry etching step. In accordance with a method for manufacturing an optical semiconductor device according to the present invention, however, part or all of the arsenic oxide can be removed in the heating step. Thus, a decrease in yield due to the residual portion can be suppressed even when the stacked semiconductor layer is etched by a reactive ion etching method using a gas containing hydrogen iodide (HI) or a gas containing chlorine in the dry etching process in the step of forming the semiconductor mesa.

A method for manufacturing an optical semiconductor device according to another aspect of the present invention includes a step of forming a stacked semiconductor layer on a substrate, the stacked semiconductor layer including a plurality of semiconductor layers; a step of forming a mask on a top layer of the stacked semiconductor layer, the mask covering a portion of the top layer; an exposing step of exposing the top layer of the stacked semiconductor layer to an oxygen-containing atmosphere; after the exposing step, an etchant supply step of supplying an etchant to the top layer of the stacked semiconductor layer; and, after the etchant supply step, a step of forming a semiconductor mesa in the stacked semiconductor layer, the semiconductor mesa being formed by etching the stacked semiconductor layer by a dry etching method using the mask. The top layer of the plurality of semiconductor layers of the stacked semiconductor layer contains arsenic. In addition, the etchant used in the etchant supply step contains aqueous ammonia, sulfuric acid, or buffered hydrofluoric acid.

In accordance with this method for manufacturing an optical semiconductor device, an etchant containing aqueous ammonia, sulfuric acid, or buffered hydrofluoric acid is supplied to the top layer of the stacked semiconductor layer in the etchant supplying step after the exposing step. Thus, even when arsenic in the top layer of the stacked semiconductor layer reacts with oxygen in an oxygen-containing atmosphere to form nonuniform arsenic oxide on the top layer in the exposing step, part or all of the arsenic oxide can be removed. Thus, when a semiconductor mesa is formed in the stacked semiconductor layer in the dry etching process, little portion of the stacked semiconductor layer is left under the arsenic oxide to form a residual portion. This can suppress the decrease in yield due to the residual portion in the manufacture of an optical semiconductor device.

DESCRIPTION OF THE PREFERRED EMBODIMENTS

Figure 1:
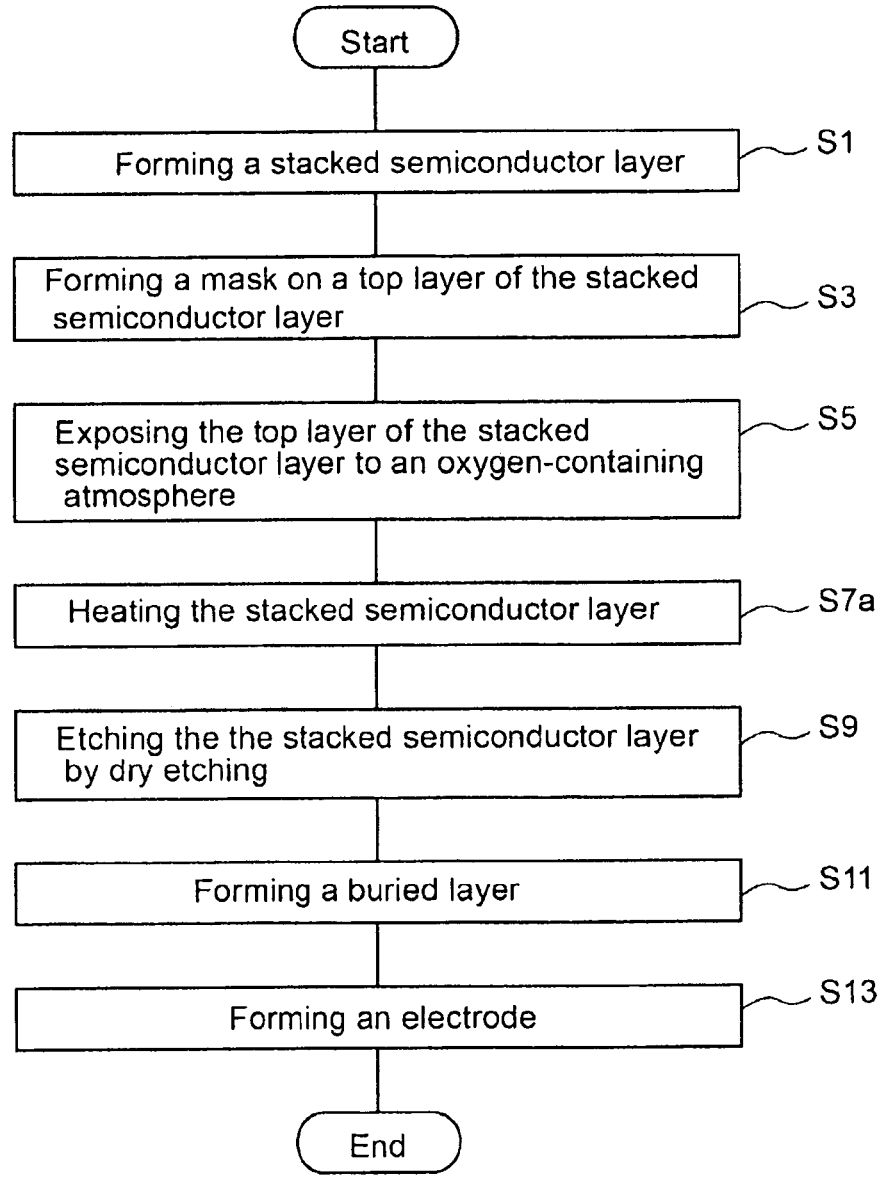
FIG. 1 is a flow chart of a method for manufacturing a semiconductor laser according to a first embodiment of the present invention.

A method for manufacturing an optical semiconductor device according to an embodiment of the present invention will be described in detail below with reference to the accompanying drawings. Like reference numerals designate like parts throughout these drawings. For the sake of clarity, the dimensional ratios in and between the components in the drawings are arbitrary.

First Embodiment

A method for manufacturing an optical semiconductor device according to a first embodiment of the present invention is a method for manufacturing a semiconductor laser described below. FIG. 1 is a flow chart of the method for manufacturing a semiconductor laser according to the present embodiment.

As illustrated in FIG. 1, the method for manufacturing a semiconductor laser according to the present embodiment mainly includes a step S1 of forming a stacked semiconductor layer (a stacked semiconductor layer forming step S1), a step S3 of forming a mask on the top layer of the stacked semiconductor layer (a mask forming step S3), a step S5 of exposing the top layer of the stacked semiconductor layer to an oxygen-containing atmosphere (an exposing step S5), a step S7a of heating the stacked semiconductor layer (a heating step S7a), a step S9 of etching the stacked semiconductor layer by dry etching (a dry etching step S9), a step S11 of forming a buried layer (a buried layer forming step S11), and a step S13 of forming an electrode (an electrode forming step S13). These steps will be described in detail below.

Stacked Semiconductor Layer Forming Step

Figure 2:
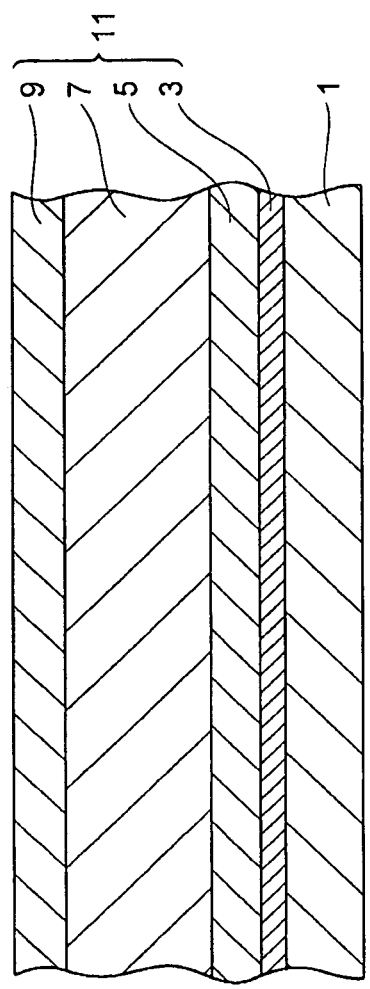
FIG. 2 is a cross-sectional view illustrating a stacked semiconductor layer forming step.

The first step is the step S1 of forming a stacked semiconductor layer on a substrate (the stacked semiconductor layer forming step S1). FIG. 2 is a cross-sectional view illustrating the stacked semiconductor layer forming step S1. As illustrated in FIG. 2, in the stacked semiconductor layer forming step S1, a stacked semiconductor layer 11 is formed on the main surface of a semiconductor substrate 1. The semiconductor substrate 1 serves as a substrate in the embodiment. The stacked semiconductor layer 11 includes a plurality of semiconductor layers for forming an optical semiconductor device (a semiconductor laser in the present embodiment). More specifically, a lower cladding layer 3, an active layer 5, an upper cladding layer 7, and a contact layer 9 are epitaxially grown in this order on the main surface of the semiconductor substrate 1, for example, by an epitaxial growth method, such as a metal-organic vapor phase epitaxy (MOVPE) method.

The semiconductor substrate 1 is a semiconductor substrate of a first conductivity type (for example, an n-type). The semiconductor substrate 1 is a III-V group compound semiconductor substrate, such as an InP substrate, doped with tin (Sn). The lower cladding layer 3 is a semiconductor layer of a first conductivity type. The lower cladding layer 3 is a III-V group compound semiconductor layer, such as an InP layer, doped with Si. The active layer 5 has a multi quantum well (MQW) structure or a single quantum well (SQW) structure. The active layer 5 is composed of a III-V group compound semiconductor, such as GaInAsP or AlGaInAs. The upper cladding layer 7 is a semiconductor layer of a second conductivity type (a p-type when the first conductivity type is the n-type). The upper cladding layer 7 is a III-V group compound semiconductor layer, such as an InP layer, doped with Zn.

The contact layer 9 is a semiconductor layer for an ohmic contact between an upper electrode 25 described below (see FIG. 14) and the stacked semiconductor layer 11. The contact layer 9 is the top layer of the stacked semiconductor layer 11. The contact layer 9 is a semiconductor layer of the second conductivity type containing arsenic (As). The contact layer 9 is composed of a III-V group compound semiconductor, such as InGaAs or GaAs.

Mask Forming Step and Exposing Step

The stacked semiconductor layer forming step S1 is followed by the mask forming step S3. In the mask forming step S3, a mask is formed on a surface 9S of the contact layer 9 so as to cover a portion of the surface 9S. In the exposing step S5, the surface 9S of the contact layer 9 is exposed to an oxygen-containing atmosphere.

Figure 3:
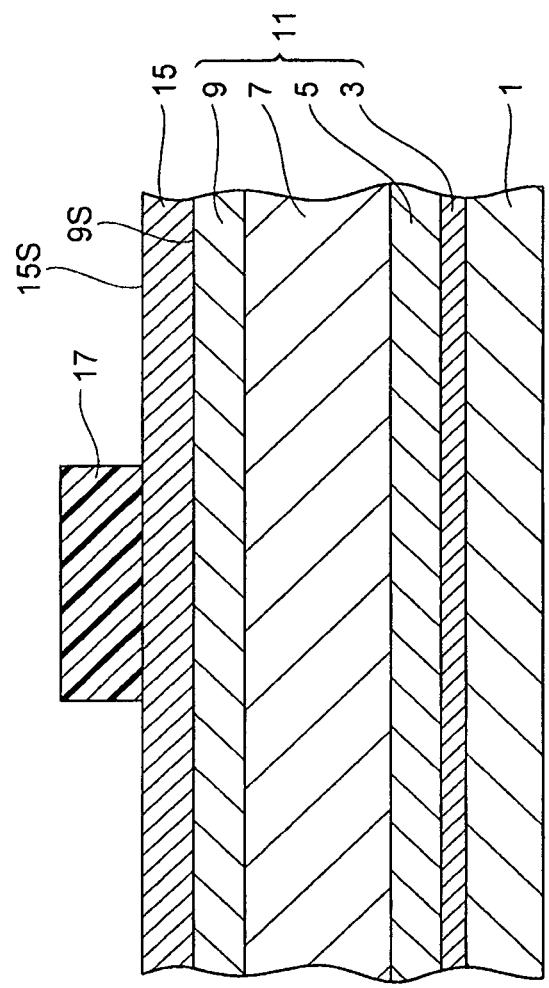
FIG. 3 is a cross-sectional view illustrating a mask forming step according to one embodiment of the present invention.
Figure 4:
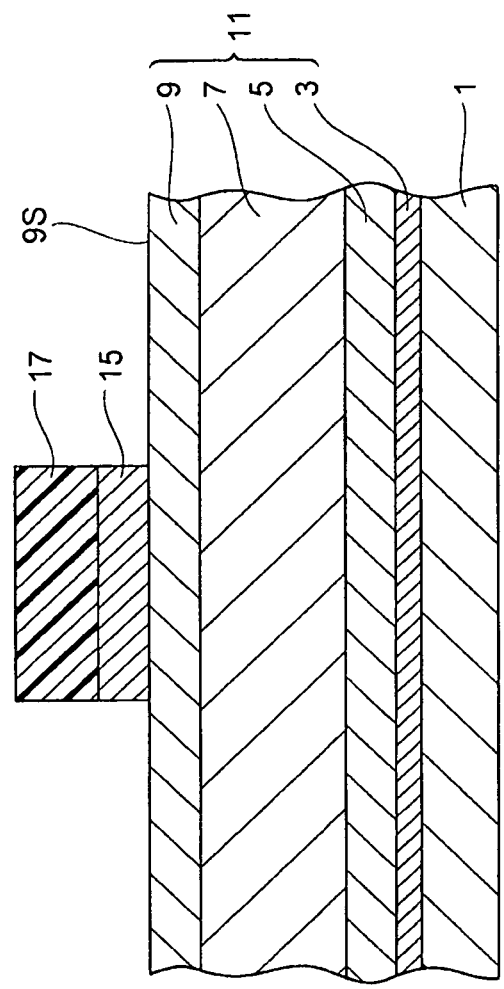
FIG. 4 is a cross-sectional view illustrating a mask forming step according to another embodiment of the present invention.
Figure 5:
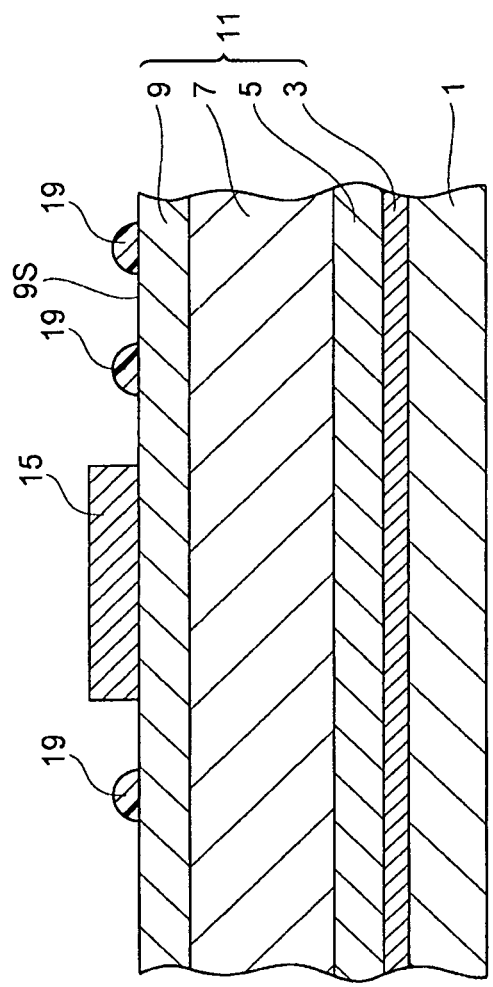
FIG. 5 is a cross-sectional view illustrating a mask forming step and an exposing step.

FIGS. 3 and 4 are cross-sectional views illustrating a mask forming step according to one embodiment of the present invention. FIG. 5 is a cross-sectional view illustrating the mask forming step S3 and the exposing step S5. As illustrated in FIG. 3, in the mask forming step S3, a mask 15 is formed on the entire surface 9S of the contact layer 9 by, for example, a plasma-enhanced chemical vapor deposition (PECVD) method. The the mask 15 is composed of an insulating film, such as a silicon nitride (SiN), silicon dioxide ($SiO_2$), or silicon oxynitride (SiON) film.

As illustrated in FIG. 3, a photoresist layer 17 having a predetermined pattern is then formed on the mask 15. The photoresist layer 17 has a shape corresponding to the semiconductor mesa M described below (see FIG. 13). More specifically, the photoresist layer 17 has a stripe-shaped pattern along a direction parallel to the main surface of the semiconductor substrate 1 (a direction perpendicular to the drawing in FIG. 3).

As illustrated in FIG. 4, the mask 15 is etched through the photoresist layer 17 to expose the surface 9S of the contact layer 9. Thus, the mask 15 has the stripe-shaped pattern along a direction parallel to the main surface of the semiconductor substrate 1 (a direction perpendicular to the drawing in FIG. 4). The mask 15 is etched, for example, by reactive ion etching (RIE) using $CF_4$ gas as an etching gas.

As illustrated in FIG. 5, the stacked semiconductor layer 11 in a chamber of a reactive ion etching apparatus used to etch the mask 15 is then taken out into the air, which is an oxygen-containing atmosphere, and the photoresist layer 17 is removed. In this manner, the mask 15 is formed on part of the surface 9S of the contact layer 9. A region of the surface 9S of the contact layer 9 not covered with the mask 15 is simultaneously exposed to the oxygen-containing atmosphere. The term "an oxygen-containing atmosphere", as used herein, refers to an atmosphere having an oxygen partial pressure of 160 hPa or more, such as air.

As illustrated in FIG. 5, when the region of the surface 9S of the contact layer 9 not covered with the mask 15 is exposed to the oxygen-containing atmosphere, arsenic in the contact layer 9 reacts with oxygen ($O_2$) in the oxygen-containing atmosphere. As a result, nonuniform arsenic oxide 19 is formed on the surface 9S of the contact layer 9. More specifically, arsenic oxide particulates 19 are formed on the surface 9S of the contact layer 9.

The formation of the arsenic oxide particulates 19 will be described below with reference to the measurement results of examples and comparative examples. Each sample for Examples 1 and 2 included the semiconductor substrate 1, the stacked semiconductor layer 11, and the mask 15 is prepared through the stacked semiconductor layer forming step S1, the mask forming step S3, and the exposing step S5. The contact layer 9 is made of InGaAs. In the mask forming step S3, the mask 15 is etched by a reactive ion etching (RIE) method using $CF_4$ gas as an etching gas. In the exposing step S5, the surface 9S of the contact layer 9 is exposed to the air. The air exposure time is 19 hours in Example 1 or 24 hours in Example 2. A sample for Comparative Example 1 is prepared in the same manner as in Examples 1 and 2 except that the exposing step S5 is not performed.

Figure 6:
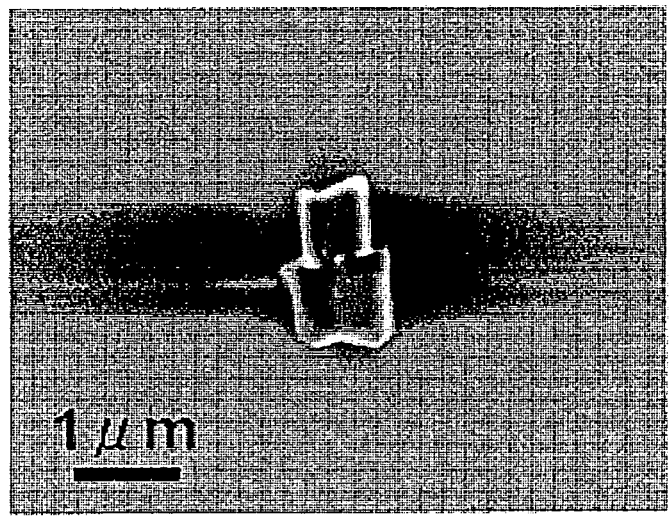
FIG. 6 is a scanning electron micrograph of a surface of a contact layer according to Example 1.

FIG. 6 is a scanning electron microscope (SEM) image of the surface 9S of the contact layer 9 according to Example 1. FIG. 6 shows that, after the exposing step S5, particulate matter having a diameter of approximately 1 μm is formed on the surface 9S of the contact layer 9 in Example 1. A composition analysis of the particulate matter with an energy dispersive X-ray analyzer of the scanning electron microscope showed that the particulate matter is arsenic (As) oxide.

Figure 7:
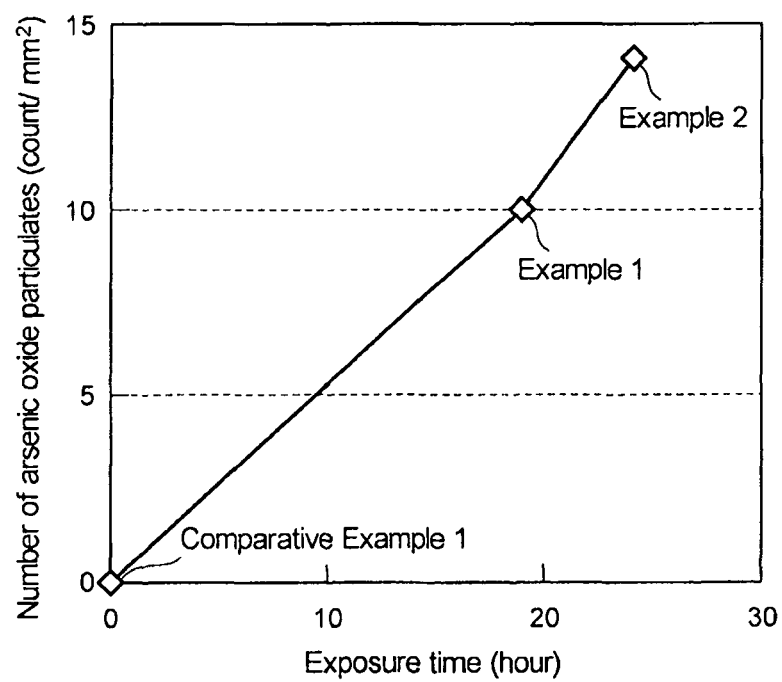
FIG. 7 is a graph of the number of arsenic oxide particulates as a function of air exposure time for Examples 1 and 2 and Comparative Example 1.

For Examples 1 and 2 and Comparative Example 1, the relationship between the air exposure time and the number of arsenic oxide particulates is examined. FIG. 7 is a graph of the number of arsenic oxide particulates as a function of air exposure time for Examples 1 and 2 and Comparative Example 1. In FIG. 7, the vertical axis represents the number of arsenic oxide particulates per $mm^2$ of the surface 9S of the contact layer 9, and the horizontal axis represents the exposure time of the surface 9S of the contact layer 9.

FIG. 7 shows that the number of arsenic oxide particulates per $mm^2$ of the surface 9S of the contact layer 9 in Comparative Example 1 (the air exposure time of the surface 9S of the contact layer 9 is zero hours) is zero. The number of arsenic oxide particulates per $mm^2$ of the surface 9S of the contact layer 9 increases with increasing exposure time. More specifically, for Example 1 (the exposure time is 19 hours), the number of arsenic oxide particulates per $mm^2$ of the surface 9S of the contact layer 9 is 10. For Example 2 (the exposure time was 24 hours), the number of arsenic oxide particulates is 14.

Heating Step

The exposing step S5 is followed by the heating step S7a. In the heating step S7a, the stacked semiconductor layer 11 is heated to a temperature of 250° C. or more.

Figure 8:
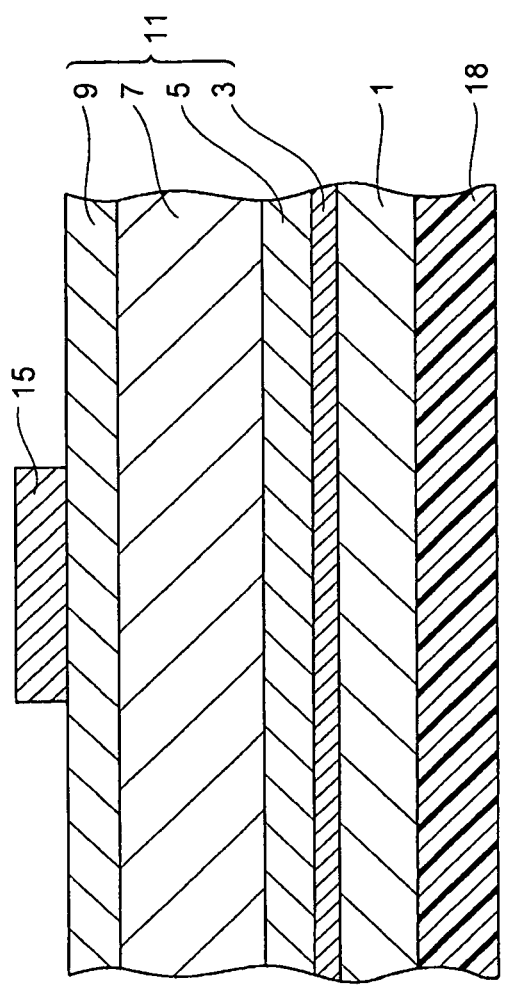
FIG. 8 is a cross-sectional view illustrating a heating step according to one embodiment of the present invention.

FIG. 8 is a cross-sectional view illustrating the heating step S7a. As illustrated in FIG. 8, in the heating step S7a, the stacked semiconductor layer 11 is heated to a temperature of 250° C. or more using a hot plate 18. More specifically, a structure composed of the semiconductor substrate 1, the stacked semiconductor layer 11, and the mask 15 is heated on the hot plate 18. In this manner, the stacked semiconductor layer 11 is heated to a temperature of 250° C. or more. In the present embodiment, the stacked semiconductor layer 11 is heated in an oxygen-containing atmosphere, such as air.

Through the heating step S7a, the arsenic oxide particulates 19 (see FIG. 5) on the surface 9S of the contact layer 9 can be removed, as illustrated in FIG. 8. This is probably because the arsenic oxide particulates 19 sublime when the stacked semiconductor layer 11 is heated to a temperature of 250° C. or more.

The heating temperature of the stacked semiconductor layer 11 in the heating step S7a is preferably 500° C. or less. When the heating temperature is 500° C. or less, evaporation of arsenic from the contact layer 9 is suppressed.

The removal of the arsenic oxide particulates 19 will be described below with reference to the measurement results of examples and comparative examples. Each sample for Examples 3 to 6 included the semiconductor substrate 1, the stacked semiconductor layer 11, and the mask 15 is prepared through the stacked semiconductor layer forming step S1, the mask forming step S3, the exposing step S5, and the heating step S7a. The semiconductor material of the contact layer 9 and a method for etching the mask 15 in the mask forming step S3 are the same as in Examples 1 and 2. In the exposing step S5, the surface 9S of the contact layer 9 is exposed to the air for 24 hours or more. In the heating step S7a, the stacked semiconductor layer 11 is heated with the hot plate 18 in the air. The heating temperatures in Examples 3, 4, 5, and 6 are 250° C., 275° C., 300° C., and 375° C., respectively. Comparative Examples 2 to 4 are prepared. Comparative Examples 2 to 4 are the same as Examples 3 to 6 except that the heating step S7a is replaced with a low-temperature heating step in which the stacked semiconductor layer 11 is heated in the air at a temperature of less than 250° C. The heating temperatures of the low-temperature heating step in Comparative Examples 2 to 4 are 100° C., 150° C., and 200° C., respectively.

Figure 9:
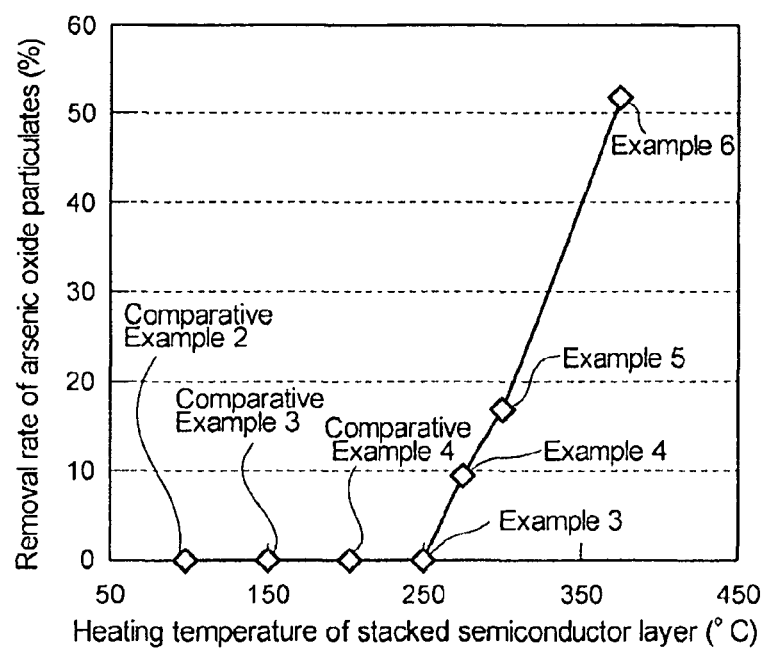
FIG. 9 is a graph of the arsenic oxide removal rate as a function of stacked semiconductor layer heating temperature for Examples 3 to 6 and Comparative Examples 2 to 4.

FIG. 9 is a graph of the arsenic oxide removal rate as a function of stacked semiconductor layer heating temperature for Examples 3 to 6 and Comparative Examples 2 to 4. In FIG. 9, the vertical axis represents the removal rate of the arsenic oxide particulates 19 after the heating step S7a or the low-temperature heating step for Examples 3 to 6 and Comparative Examples 2 to 4 on the basis of the number of arsenic oxide particulates 19 on the surface 9S of the contact layer 9 immediately before the heating step S7a or the low-temperature heating step. In FIG. 9, the horizontal axis represents the heating temperature of the stacked semiconductor layer 11 in the heating step S7a or the low-temperature heating step for Examples 3 to 6 and Comparative Examples 2 to 4.

FIG. 9 shows that the removal rates of the arsenic oxide particulates 19 after the low-temperature heating step in Comparative Examples 2 to 4 are approximately zero. In contrast, the removal rates of the arsenic oxide particulates 19 after the heating step S7a in Examples 4 to 6 are 9%, 17%, and 52%, respectively. Thus, heating of the stacked semiconductor layer 11 to a temperature of 250° C. or more in the heating step S7a can remove at least part of the arsenic oxide particulates 19.

The relationship between the arsenic removal rate and the heating time of the stacked semiconductor layer 11 in the heating step S7a is examined in Example 5. More specifically, with respect to a sample of Example 5 (the stacked semiconductor layer 11 is heated to 300° C. in the heating step S7a), the arsenic removal rate is measured while the heating time at 300° C. is changed.

Figure 10:
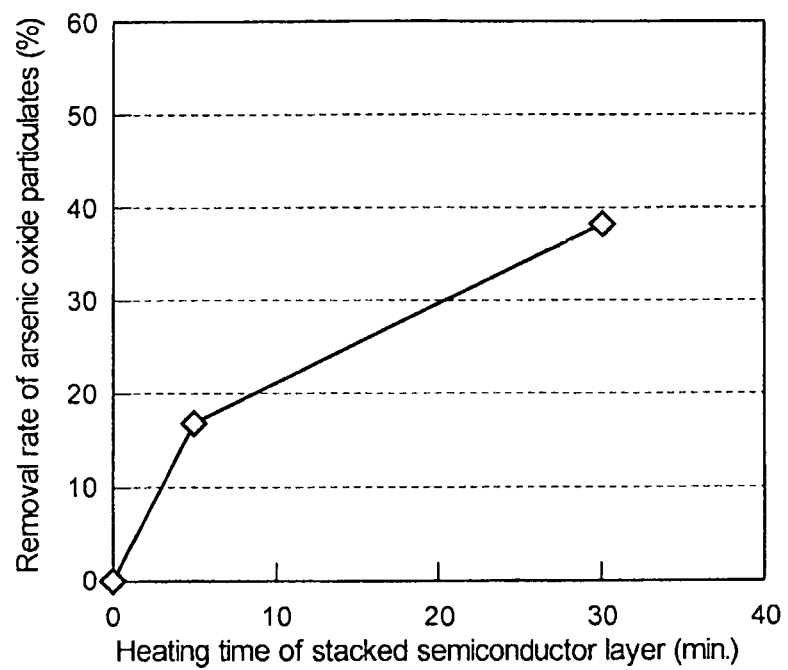
FIG. 10 is a graph of the arsenic removal rate as a function of heating time in a heating step in Example 5.

FIG. 10 is a graph of the arsenic removal rate as a function of heating time in the heating step S7a in Example 5. In FIG. 10, the vertical axis represents the arsenic removal rate after the heating step S7a in Example 5 on the basis of the number of arsenic oxide particulates 19 immediately before the heating step S7a. The horizontal axis represents the heating time of the stacked semiconductor layer 11 in the heating step S7a (the holding time of the stacked semiconductor layer 11 at 300° C.).

FIG. 10 shows that the removal rate of the arsenic oxide particulates 19 in Example 5 is 17% for the heating time of 5 minutes or 38% for the heating time of 30 minutes. Thus, in order to remove a larger number of arsenic oxide particulates 19, the heating time of the stacked semiconductor layer 11 in the heating step S7a is preferably 5 minutes or more. The heating time of the stacked semiconductor layer 11 in the heating step S7a is more preferably 30 minutes or more.

Dry Etching Step

The heating step S7a is followed by the dry etching step S9. In the dry etching step S9, the stacked semiconductor layer 11 is etched by a dry etching method using the mask 15. This forms a semiconductor mesa from the stacked semiconductor layer 11.

Figure 11:
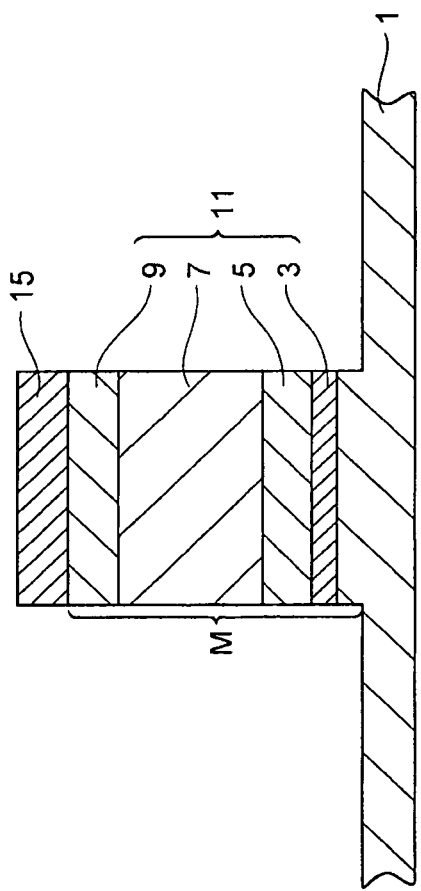
FIG. 11 is a cross-sectional view illustrating a dry etching step.

FIG. 11 is a cross-sectional view illustrating the dry etching step S9. As illustrated in FIG. 11, in the dry etching step S9, the stacked semiconductor layer 11 and the semiconductor substrate 1 are etched by a dry etching method using the mask 15. The semiconductor mesa M in the stacked semiconductor layer 11 and the semiconductor substrate 1 is formed by etching. In the dry etching step S9 according to the present embodiment, the stacked semiconductor layer 11 and the semiconductor substrate 1 are etched to the middle of the semiconductor substrate 1. Alternatively, the etching is stopped in the middle of the stacked semiconductor layer 11. In this case, the semiconductor substrate 1 is not etched, and the semiconductor mesa M is formed only in the stacked semiconductor layer 11.

The semiconductor mesa M protrudes in the thickness direction of the semiconductor substrate 1 (a direction perpendicular to the main surface of the semiconductor substrate 1) and extends in a direction parallel to the main surface of the semiconductor substrate 1 (a direction perpendicular to the drawing in FIG. 11), thus having a stripe-shaped pattern.

The dry etching method used in the dry etching step S9 is, for example, a reactive ion etching (RIE) method.

Figure 12:
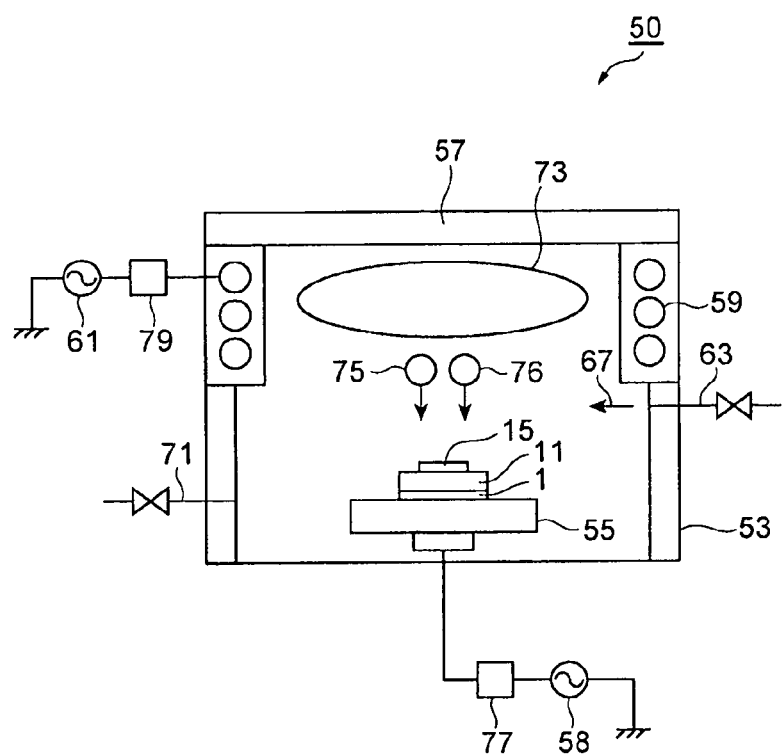
FIG. 12 is a schematic view of a cross-sectional structure of a reactive ion etching apparatus.

Referring to FIG. 12, an example of the reactive ion etching (RIE) method that is used in the present embodiment will be described in detail below. FIG. 12 is a schematic view of a cross-sectional structure of a reactive ion etching apparatus. The reactive ion etching apparatus according to the present embodiment is inductively coupled plasma reactive ion etching (ICP RIE) equipment 50. The inductively coupled plasma reactive ion etching equipment 50 includes a vacuum chamber 53 in which a target sample (in the present embodiment, the stacked semiconductor layer 11 on the semiconductor substrate 1, the surface of the stacked semiconductor layer 11 being partly masked with the mask 15) is subjected to reactive ion etching. The vacuum chamber 53 contains a lower electrode 55 and an upper electrode 57 facing each other. The lower electrode 55 and the upper electrode 57 can generate a high-frequency discharge. The upper electrode 57 is grounded.

The target sample, the stacked semiconductor layer 11, is placed on top of the lower electrode 55 under the upper electrode 57. The lower electrode 55 has a cooling mechanism for cooling the target sample. The lower electrode 55 is connected to a high-frequency power source 58 via an impedance matching circuit 77. The high-frequency power source 58 can apply a high-frequency power (bias electric power) to the lower electrode 55. The bias electric power is supplied to control a direct-current bias applied to the lower electrode 55. The vacuum chamber 53 is surrounded by an induction coil 59. The induction coil 59 is connected to an inductively coupled plasma power supply 61 via an impedance matching circuit 79. The inductively coupled plasma power supply 61 can supply high-frequency power (ICP electric power) to the induction coil 59. The ICP electric power is supplied to generate inductively coupled plasma (ICP).

The vacuum chamber 53 also contains a gas supply pipe 63 for supplying an etching gas and a gas exhaust pipe 71 for discharging the etching gas. An etching gas 67 can be supplied to the vacuum chamber 53 through the gas supply pipe 63. The gas exhaust pipe 71 is connected to a vacuum pump, which allows the vacuum chamber 53 to maintain a predetermined degree of vacuum. The vacuum chamber 53 has two gas supply pipes for supplying an etching gas. In this case, a gas mixture of two types of gases can be supplied as an etching gas to the vacuum chamber 53.

When the target sample, the stacked semiconductor layer 11, is etched, the etching gas 67 is supplied to the vacuum chamber 53. When the high-frequency power (ICP electric power) is supplied to the induction coil 59 from the inductively coupled plasma power supply 61, a high-frequency electric field between the lower electrode 55 and the upper electrode 57 generates inductively coupled plasma 73. Ions 75 and radicals 76 in the inductively coupled plasma 73 are accelerated by an electric field resulting from the direct-current bias applied to the lower electrode 55 and reach the target sample, the stacked semiconductor layer 11.

The etching conditions for the reactive ion etching method used as the dry etching method in the dry etching step S9 is as follows: the etching gas flow rate is 60 sccm, the internal pressure of the vacuum chamber 53 is 1.5 Pa, the ICP electric power is 400 W, and the bias electric power is 150 W.

Buried Layer Forming Step

Figure 13:
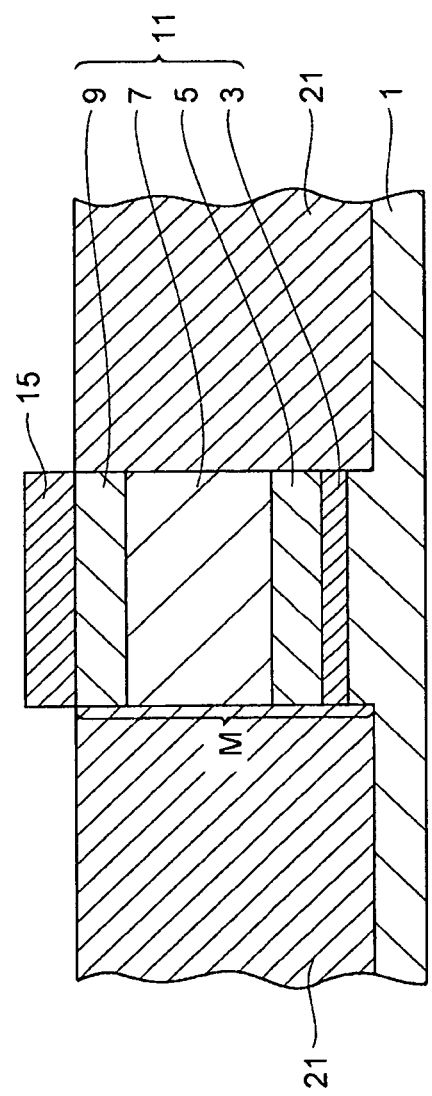
FIG. 13 is a cross-sectional view illustrating a buried layer forming step.

The dry etching step S9 is followed by the buried layer forming step S11. FIG. 13 is a cross-sectional view illustrating the buried layer forming step S11.

As illustrated in FIG. 13, in the buried layer forming step S11, a buried layer 21 made of a semiconductor material is formed on the semiconductor substrate 1 and adjacent to the semiconductor mesa M, for example, by an epitaxial growth method, such as a metal-organic vapor phase epitaxy (MOVPE) method, using the mask 15. As a result, the side surface of the semiconductor mesa M is surrounded by the buried layer 21. The buried layer 21 is made of, for example, a semi-insulating semiconductor material. The semi-insulating semiconductor material is a III-V group compound semiconductor material, such as Fe-doped InP.

Electrode Forming Step

Figure 14:
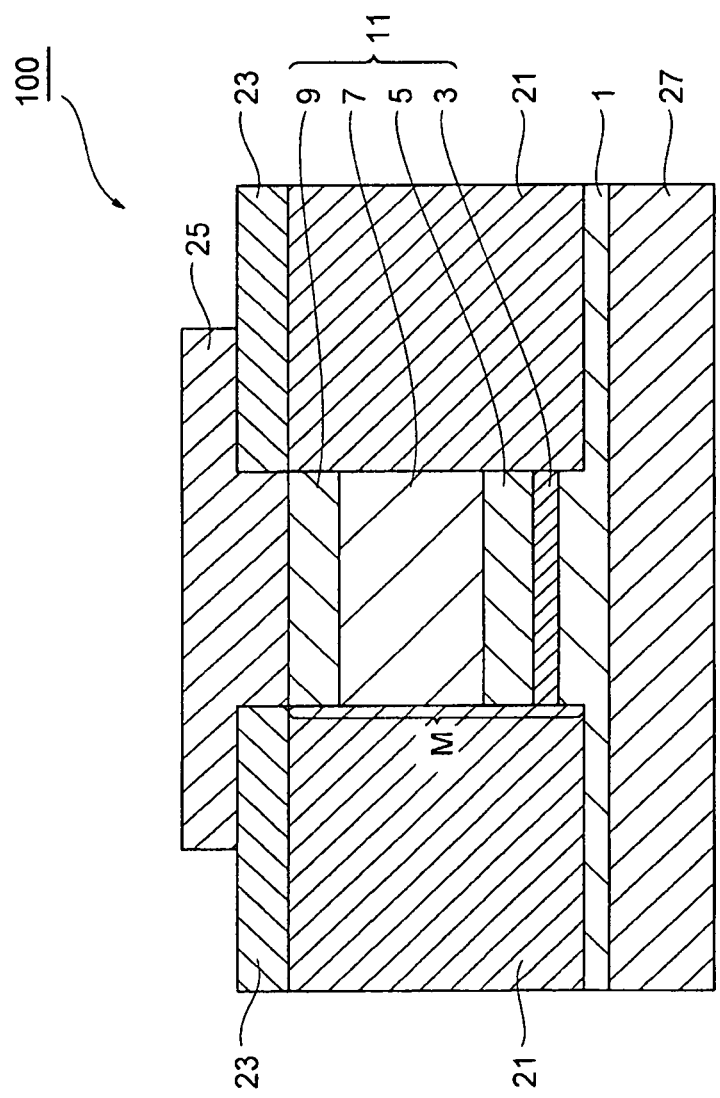
FIG. 14 is a cross-sectional view illustrating an electrode forming step.

The dry etching step S9 is followed by the electrode forming step S13. FIG. 14 is a cross-sectional view illustrating the electrode forming step S13.

As illustrated in FIG. 14, in the electrode forming step S13, an insulating layer 23 made of, for example, silicon nitride (SiN) or silicon dioxide ($SiO_2$) is formed on the buried layer 21 by a plasma-enhanced chemical vapor deposition (PECVD) method after the mask 15 has been removed. An opening is then formed in the insulating layer 23. An upper electrode 25 made of a metallic material is formed on the stacked semiconductor layer 11 and the insulating layer 23, for example, by a vacuum evaporation method. The upper electrode 25 is in contact with the contact layer 9 of the stacked semiconductor layer 11 through the opening. The back side of the semiconductor substrate 1 is polished to decrease the thickness of the semiconductor substrate 1. A lower electrode 27 made of a metallic material is then formed on the back side of the semiconductor substrate 1, for example, by a vacuum evaporation method. A semiconductor laser 100 is then manufactured by dividing into chips.

In accordance with the method for manufacturing an optical semiconductor device according to the present embodiment, in the exposing step S5, arsenic in the contact layer 9 reacts with oxygen contained in the oxygen-containing atmosphere to form the arsenic oxide particulates 19 on the surface 9S of the contact layer 9 (see FIG. 5). However, part or all of the arsenic oxide particulates 19 is removed from the surface 9S of the contact layer 9 by heating the stacked semiconductor layer 11 to a temperature of 250° C. or more in the heating step S7a (see FIG. 8). Thus, when the semiconductor mesa M is formed from the stacked semiconductor layer 11 in the dry etching step S9, little portion of the stacked semiconductor layer 11 is left under the arsenic oxide particulates 19 to form a residual portion (see FIGS. 8 and 11). This can suppress the decrease in yield due to the residual portion in the manufacture of an optical semiconductor device.

In accordance with the method for manufacturing an optical semiconductor device according to the present embodiment, in the dry etching step S9, the stacked semiconductor layer 11 is preferably etched by a reactive ion etching method using a gas containing hydrogen iodide (HI) or a gas containing chlorine for the following reason (see FIG. 11). The gas containing chlorine is a gas containing at least one of chlorine $Cl_2$, silicon tetrachloride $SiCl_4$, and boron trichloride $BCl_3$.

The arsenic oxide particulates 19 are difficult to etch in dry etching by a reactive ion etching method using a gas containing hydrogen iodide (HI) or a gas containing chlorine. Thus, the presence of arsenic oxide on the surface 9S of the contact layer 9 immediately before the dry etching step S9 tends to result in the formation of a residual portion of the stacked semiconductor layer 11 under the arsenic oxide particulates 19 after the dry etching step S9 (see FIGS. 5, 8, and 11). In accordance with the method for manufacturing an optical semiconductor device according to the present embodiment, however, part or all of the arsenic oxide particulates 19 can be removed in the heating step S7a (see FIG. 8). Thus, a decrease in yield due to the residual portion can be suppressed even when the stacked semiconductor layer 11 is etched by a reactive ion etching method using a gas containing hydrogen iodide (HI) or a gas containing chlorine in the buried layer forming step S11.

When the stacked semiconductor layer 11 is etched by the reactive ion etching (RIE) method in the dry etching step S9, gas containing hydrocarbon such as a gas mixture of methane gas ($CH_4$) and hydrogen gas ($H_2$) is also used as an etching gas for RIE.

Second Embodiment

A method for manufacturing an optical semiconductor device according to a second embodiment of the present invention will be described below. In the following embodiments, differences from the first embodiment are mainly described, and the same description as the first embodiment may be omitted.

A method for manufacturing an optical semiconductor device according to the second embodiment is different from the method for manufacturing an optical semiconductor device according to the first embodiment in terms of the heating step S7a. In addition, the method for manufacturing an optical semiconductor device according to the second embodiment further includes a reduced pressure step of maintaining the stacked semiconductor layer 11 under reduced pressure after the exposing step S5 and before the heating step S7a.

Figure 15:
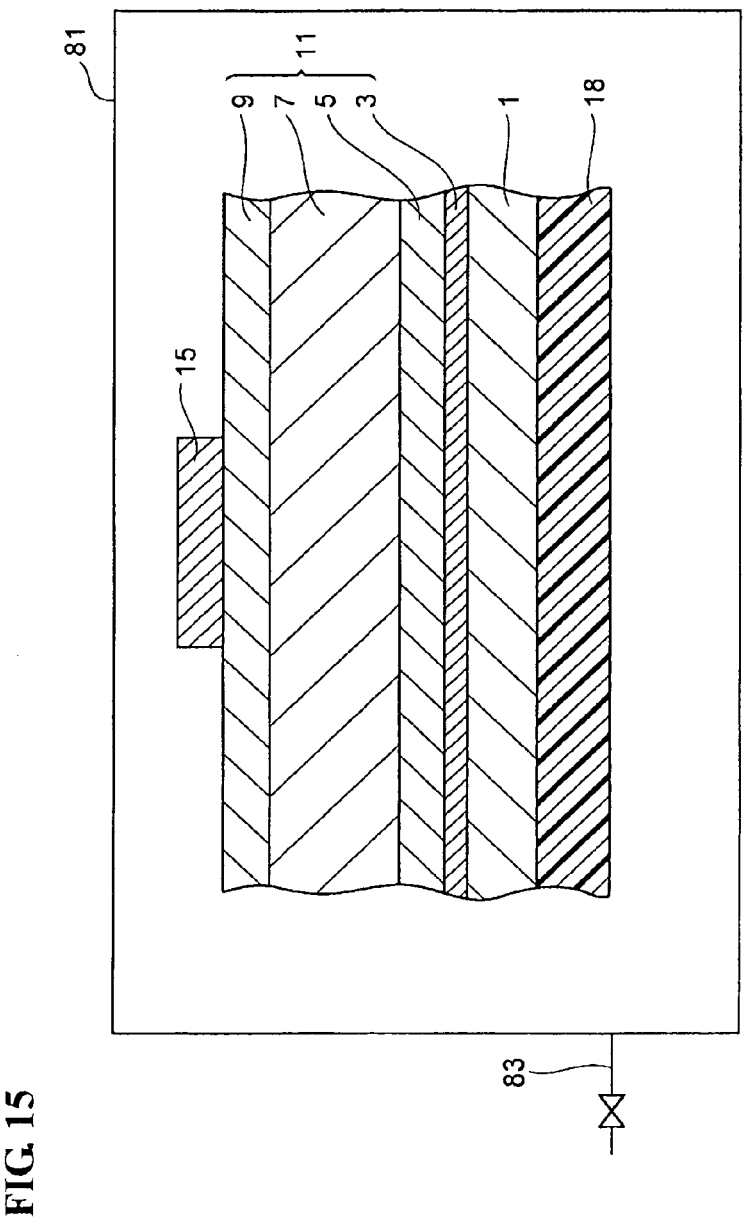
FIG. 15 is a cross-sectional view illustrating a reduced pressure step and a heating step according to a second embodiment of the present invention.

FIG. 15 is a cross-sectional view illustrating the reduced pressure step and the heating step S7a according to the present embodiment. As illustrated in FIG. 15, in the reduced pressure step, the stacked semiconductor layer 11 is placed in a vacuum chamber 81. The vacuum chamber 81 is provided with a gas exhaust pipe 83 for discharging gas from the vacuum chamber 81. The gas exhaust pipe 83 is connected to a vacuum pump, which can evacuate the vacuum chamber 81 of gas. Thus, the stacked semiconductor layer 11 can be maintained under reduced pressure. The degree of vacuum under which the stacked semiconductor layer 11 is maintained is preferably 500 Pa or less.

The reduced pressure step is followed by the heating step S7a. This heating step S7a is different from the heating step S7a according to the first embodiment in that the stacked semiconductor layer 11 is heated under the same reduced pressure as in the reduced pressure step. The method and conditions for heating the stacked semiconductor layer 11 are the same as in the heating step S7a according to the first embodiment.

In accordance with the method for manufacturing an optical semiconductor device according to the present embodiment, for the same reason as the method for manufacturing an optical semiconductor device according to the first embodiment, a decrease in yield due to the residual portion can be suppressed in the manufacture of the optical semiconductor device.

The method for manufacturing an optical semiconductor device according to the present embodiment further includes the reduced pressure step of maintaining the stacked semiconductor layer 11 under reduced pressure after the exposing step S5 and before the heating step S7a. Furthermore, in the heating step S7a, the stacked semiconductor layer 11 is heated under the same reduced pressure as in the reduced pressure step. This can prevent the contact layer 9, which is the top layer of the stacked semiconductor layer 11, from being oxidized in the heating step S7a.

In accordance with the method for manufacturing an optical semiconductor device according to the present embodiment, the stacked semiconductor layer 11 is preferably maintained under reduced pressure from the reduced pressure step to the heating step S7a (see FIGS. 5, 11, and 15). This can prevent arsenic oxide to be formed again on the surface 9S of the contact layer 9 from the removal of the arsenic oxide particulates 19 from the surface 9S of the contact layer 9 in the heating step S7a to the dry etching step S9. This can further suppress the decrease in yield due to the residual portion in the manufacture of the optical semiconductor device.

The stacked semiconductor layer 11 is maintained under reduced pressure from the reduced pressure step to the heating step S7a, for example, by connecting the vacuum chamber 81 to a chamber of a dry etching apparatus used in the dry etching step S9 (for example, the vacuum chamber 53 of the inductively coupled plasma reactive ion etching equipment 50 (see FIG. 12)). This structure allows the stacked semiconductor layer 11 after the heating step S7a to be transferred to the chamber of the dry etching apparatus without exposed to the air before the dry etching step S9.

Third Embodiment

A method for manufacturing an optical semiconductor device according to a third embodiment will be described below. The method for manufacturing an optical semiconductor device according to the third embodiment is different from the method for manufacturing an optical semiconductor device according to the first embodiment in terms of the heating step S7a.

Figure 16:
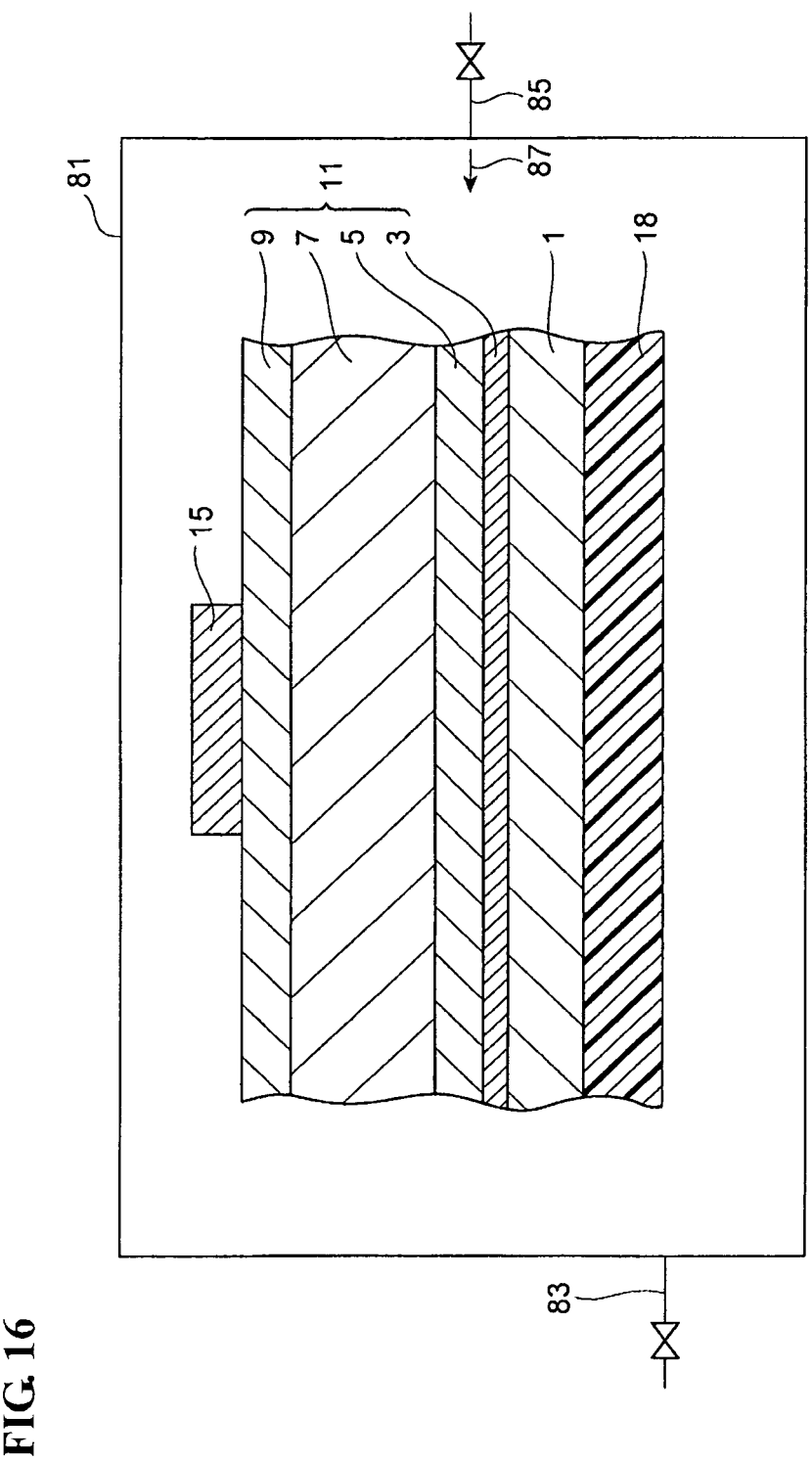
FIG. 16 is a cross-sectional view illustrating a heating step according to the second embodiment.

FIG. 16 is a cross-sectional view illustrating the heating step S7a according to the present embodiment. As illustrated in FIG. 16, in the heating step S7a according to the present embodiment, the stacked semiconductor layer 11 is placed in a vacuum chamber 81. The vacuum chamber 81 is provided with a gas supply pipe 85 for supplying gas 87 and a gas exhaust pipe 83 for discharging gas from the vacuum chamber 81. The gas exhaust pipe 83 is connected to a vacuum pump. After the vacuum pump has evacuated gas in the vacuum chamber 81, the gas 87 is supplied to the vacuum chamber 81 through the gas supply pipe 85. Thus, the stacked semiconductor layer 11 is maintained in an atmosphere of the gas 87. While the stacked semiconductor layer 11 is maintained in an atmosphere of the gas 87, the heating step S7a is performed. Thus, the heating step S7a can be performed in an atmosphere other than air.

In accordance with the method for manufacturing an optical semiconductor device according to the present embodiment, for the same reason as the method for manufacturing an optical semiconductor device according to the first embodiment, a decrease in yield due to the residual portion can be suppressed in the manufacture of the optical semiconductor device.

In accordance with the method for manufacturing an optical semiconductor device according to the present embodiment, the gas 87 is preferably nitrogen, argon, or helium. In other words, the heating step S7a is preferably performed while the stacked semiconductor layer 11 is maintained in a nitrogen atmosphere, an argon atmosphere, or a helium atmosphere. This can prevent arsenic oxide to be formed again on the surface 9S of the contact layer 9 after the removal of the arsenic oxide particulates 19 from the surface 9S of the contact layer 9 in the heating step S7a (see FIGS. 5, 11, and 16). This can further suppress the decrease in yield due to the residual portion in the manufacture of the optical semiconductor device.

In accordance with the method for manufacturing an optical semiconductor device according to the present embodiment, the gas 87 is preferably a gas containing an arsenic compound, such as arsine ($AsH_3$). More specifically, the heating step S7a is preferably performed while the stacked semiconductor layer 11 is maintained in an atmosphere of a gas containing an arsenic compound, such as arsine ($AsH_3$). This can prevent evaporation of arsenic from the contact layer 9 in the heating step S7a.

In accordance with the method for manufacturing an optical semiconductor device according to the present embodiment, when the top layer of the stacked semiconductor layer 11 is composed of a compound containing phosphorus (P) as in the contact layer 9, the gas 87 is preferably a gas containing a phosphorus compound, such as phosphine ($PH_3$). More specifically, the heating step S7a is preferably performed while the stacked semiconductor layer 11 is maintained in an atmosphere of a gas containing a phosphorus compound, such as phosphine ($PH_3$). This can prevent evaporation of phosphorus (P) from the top layer of the stacked semiconductor layer 11 in the heating step S7a.

Fourth Embodiment

Figure 17:
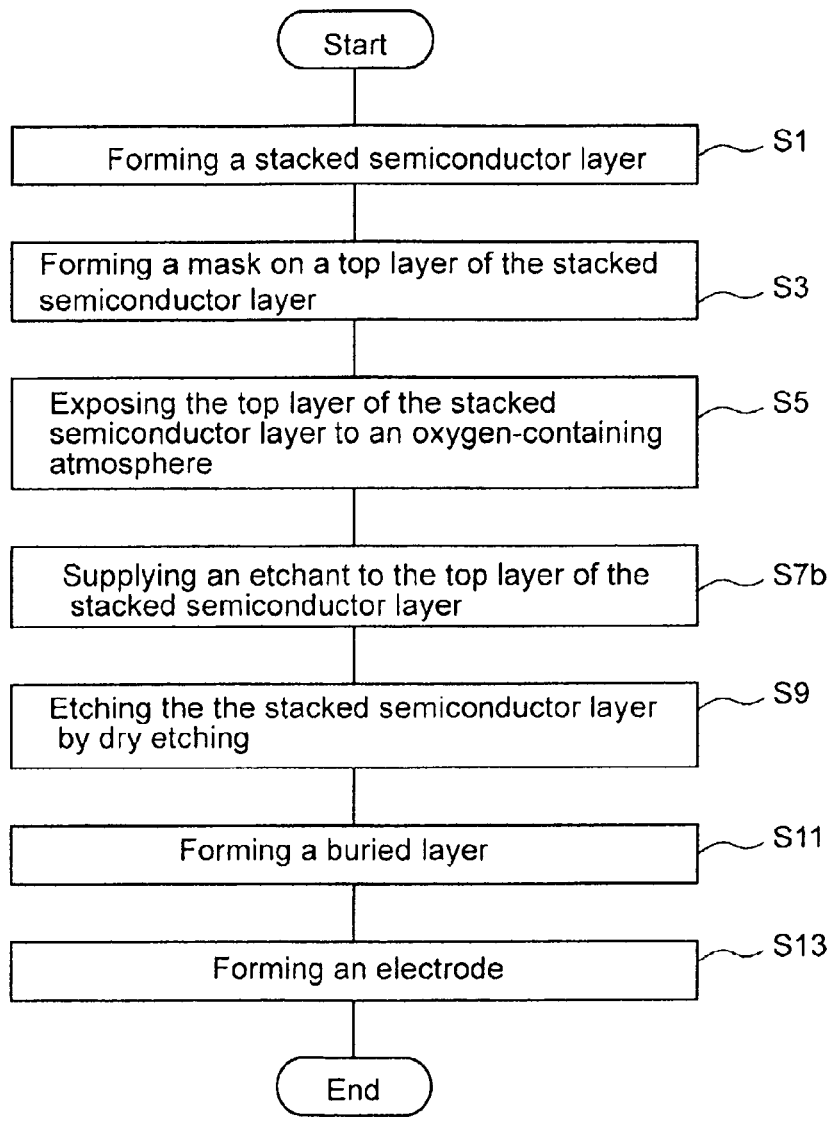
FIG. 17 is a flow chart of a method for manufacturing a semiconductor laser according to a fourth embodiment of the present invention.

A method for manufacturing an optical semiconductor device according to a fourth embodiment of the present invention will be described below. FIG. 17 is a flow chart of the method for manufacturing a semiconductor laser according to the fourth embodiment. As illustrated in FIG. 17, the method for manufacturing an optical semiconductor device according to the present embodiment is different from the method for manufacturing an optical semiconductor device according to the first embodiment in that the heating step S7a in the first embodiment is replaced with an etchant supplying step S7b.

Figure 18:
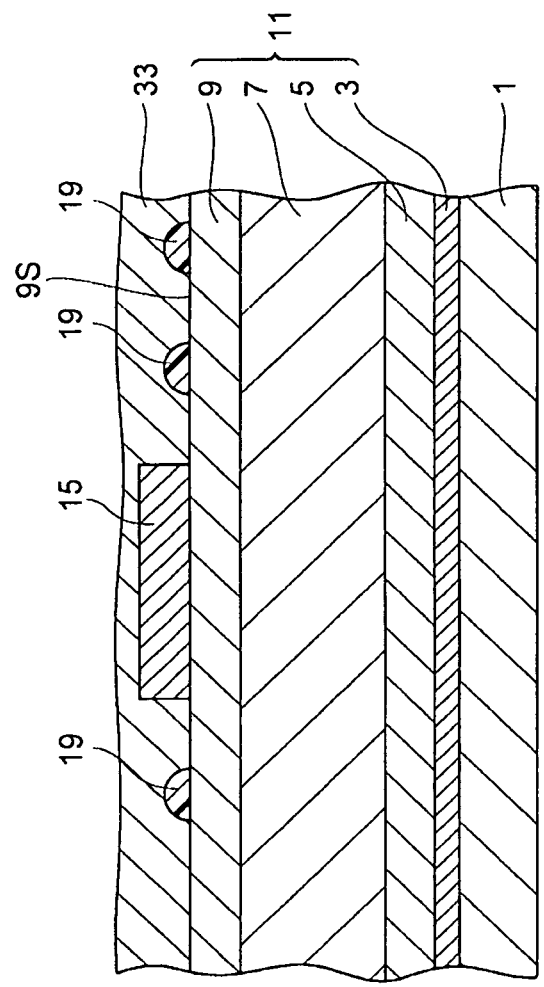
FIG. 18 is a cross-sectional view illustrating an etchant supplying step.
Figure 19:
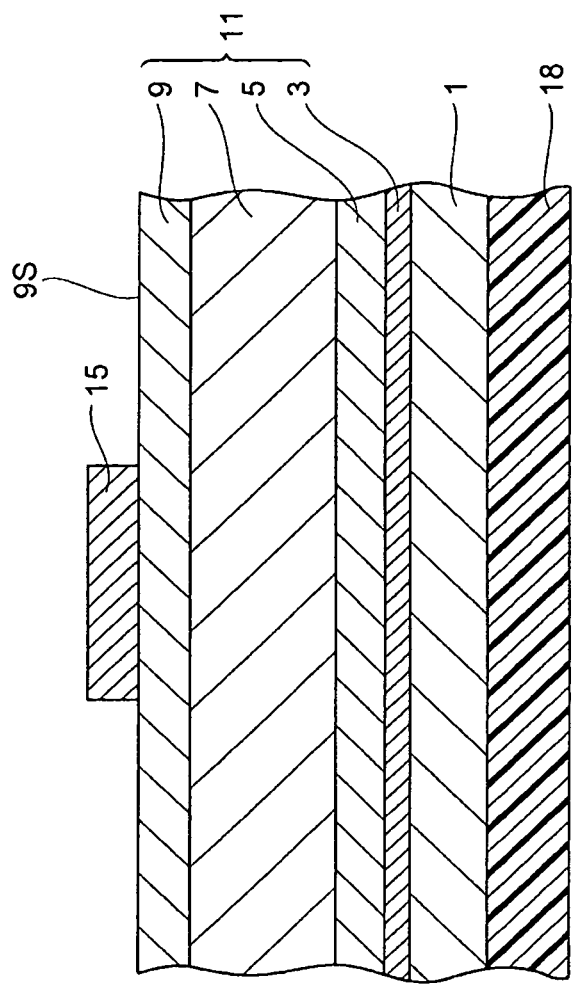
FIG. 19 is a cross-sectional view illustrating the etchant supplying step.

FIGS. 18 and 19 are cross-sectional views illustrating the etchant supplying step S7b. As illustrated in FIG. 18, in the etchant supplying step S7b, an etchant 33 is supplied to the surface 9S of the contact layer 9. The etchant 33 is aqueous ammonia, sulfuric acid, or buffered hydrofluoric acid, or a solution containing any of aqueous ammonia, sulfuric acid, and buffered hydrofluoric acid.

As illustrated in FIG. 19, the etchant 33 can be removed together with arsenic oxide particulates 19. Since arsenic oxide can be etched with the etchant 33, the arsenic oxide can be removed.

In the etchant supplying step S7b, the contact layer 9 may not be etched or may be partly etched with the etchant 33.

An experiment on the removal of the arsenic oxide particulates 19 will be described below. A plurality of samples are prepared through the stacked semiconductor layer forming step S1, the mask forming step S3, and the exposing step S5. Specifically, a sample subjected to the etchant supplying step S7b using aqueous ammonia (having a concentration of 1% by weight) as the etchant 33, a sample subjected to the etchant supplying step S7b using sulfuric acid (having a concentration of 96% by weight) as the etchant 33, a sample subjected to the etchant supplying step S7b using buffered hydrofluoric acid as the etchant 33, and a sample not subjected to the etchant supplying step S7b are prepared. Then, these samples are subjected to the dry etching step S9. After the dry etching step S9, the number of residual portions is counted.

Figure 20:
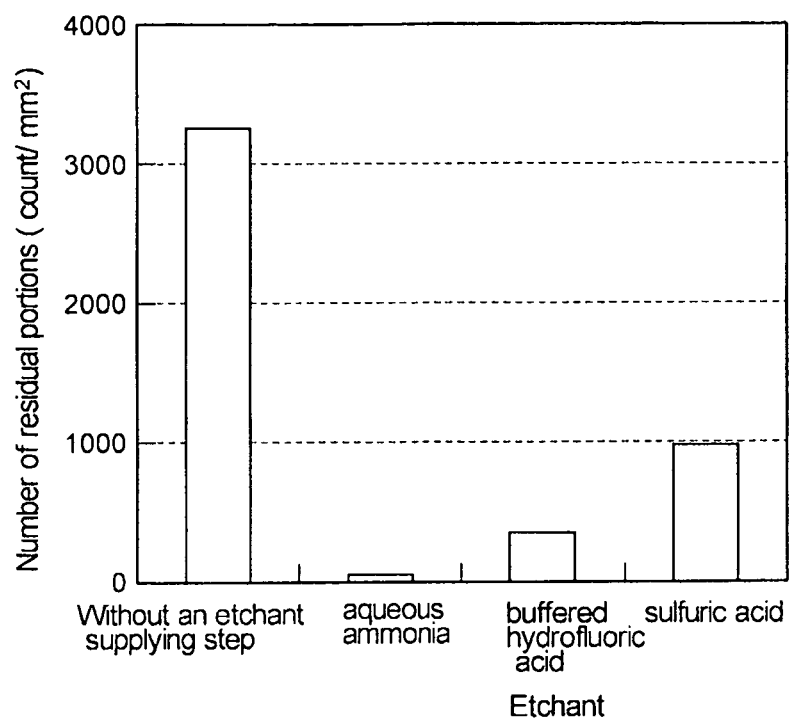
FIG. 20 is a graph of the number of residual portions after a dry etching step.

FIG. 20 shows the results. FIG. 20 shows that without the etchant supplying step S7b (without an etchant supplying step), the number of residual portions after the dry etching step S9 is 3240/$mm^2$. In contrast, when aqueous ammonia, buffered hydrofluoric acid or sulfuric acid is used as the etchant 33, the number of residual portions after the dry etching step S9 is 64, 353, or 983/$mm^2$, respectively.

Thus, the arsenic oxide particulates 19 can be removed in the etchant supplying step S7b. This can decrease the number of residual portions formed after the dry etching step S9. It is found that aqueous ammonia is preferred as the etchant 33.

In accordance with the method for manufacturing an optical semiconductor device according to the present embodiment, the etchant 33 containing aqueous ammonia, sulfuric acid, or buffered hydrofluoric acid is supplied to the surface 9S of the contact layer 9 of the stacked semiconductor layer 11 in the etchant supplying step S7b. Thus, even when arsenic in the contact layer 9 reacts with oxygen in an oxygen-containing atmosphere to form arsenic oxide particulates 19 on the surface 9S of the contact layer 9 in the exposing step S5, part or all of the arsenic oxide particulates 19 can be removed (see FIGS. 5, 18, and 19). Thus, when the semiconductor mesa M is formed from the stacked semiconductor layer 11 in the dry etching step S9, little portion of the stacked semiconductor layer 11 is left under the arsenic oxide particulates 19 to form a residual portion. This can suppress the decrease in yield due to the residual portion in the manufacture of the optical semiconductor device.

In order to effectively remove the arsenic oxide particulates 19, aqueous ammonia used as the etchant 33 preferably has a concentration of 1% by weight or more. Sulfuric acid used as the etchant 33 preferably has a concentration of 96% by weight or more.

In accordance with the method for manufacturing an optical semiconductor device according to the present embodiment, for the same reason as the method for manufacturing an optical semiconductor device according to the first embodiment, the stacked semiconductor layer 11 is preferably etched by a reactive ion etching method using a gas containing hydrogen iodide (HI) or a gas containing chlorine in the dry etching step S9 (see FIG. 11).

The present invention is not limited to these embodiments and may include various modifications thereof.

For example, although the first to fourth embodiments relate to a method for manufacturing a semiconductor laser, an optical semiconductor device, such as a semiconductor optical modulator or a semiconductor light-receiving device, may be manufactured. In accordance with the present invention, a semiconductor optical modulator may be manufactured by forming an optical waveguide layer made of a semiconductor material instead of the active layer 5 in the stacked semiconductor layer forming step S1.

What is claimed is:

1. A method for manufacturing an optical semiconductor device, comprising:
    a step of forming a stacked semiconductor layer on a substrate, the stacked semiconductor layer including a plurality of semiconductor layers with a top layer of the plurality of layers containing arsenic;
    a step of forming a mask on the top layer whereby a portion of the top layer is covered by the mask and a region of the top layer is not covered by the mask;
    an exposing step of exposing the region of the top layer not covered by the mask to an oxygen-containing atmosphere whereby arsenic oxide forms on the region;
    after the exposing step, a heating step of heating the stacked semiconductor layer to a temperature of 250° C. or more to remove arsenic oxide from the top layer; and
    after the heating step, a step of forming a semiconductor mesa in the stacked semiconductor layer, the semiconductor mesa being formed by etching the stacked semiconductor layer by a dry etching method using the mask.

2. The method for manufacturing an optical semiconductor device according to claim 1, further comprising a reduced pressure step of maintaining the stacked semiconductor layer under reduced pressure after the exposing step and before the heating step,
    wherein the stacked semiconductor layer is maintained under reduced pressure between the reduced pressure step and the step of forming the semiconductor mesa.

3. The method for manufacturing an optical semiconductor device according to claim 1, wherein the heating step is performed while the stacked semiconductor layer is maintained in a nitrogen atmosphere, an argon atmosphere, or a helium atmosphere.

4. The method for manufacturing an optical semiconductor device according to claim 1, wherein, in the step of forming the semiconductor mesa, the stacked semiconductor layer is etched by a reactive ion etching method using a gas containing hydrogen iodide (HI) or a gas containing chlorine.

5. The method for manufacturing an optical semiconductor device according to claim 4, wherein the gas containing chlorine is a gas containing at least one of chlorine $Cl_2$, silicon tetrachloride $SiCl_4$, and boron trichloride $BCl_3$.

6. A method for manufacturing an optical semiconductor device, comprising:
   a step of forming a stacked semiconductor layer on a substrate, the stacked semiconductor layer including a plurality of semiconductor layers with a top layer of the plurality of layers containing arsenic;
   a step of forming a mask on the top layer whereby a portion of the top layer is covered by the mask and a region of the top layer is not covered by the mask;
   an exposing step of exposing the region of the top layer not covered by the mask to an oxygen-containing atmosphere whereby arsenic oxide forms on the region;
   after the exposing step, an etchant supply step of supplying an etchant to the top layer to remove arsenic oxide from the top layer; and
   after the etchant supply step, a step of forming a semiconductor mesa in the stacked semiconductor layer, the semiconductor mesa being formed by etching the stacked semiconductor layer by a dry etching method using the mask,
   wherein the etchant used in the etchant supply step contains aqueous ammonia, sulfuric acid, or buffered hydrofluoric acid.

7. The method for manufacturing an optical semiconductor device according to claim 6, wherein, in the step of forming the semiconductor mesa, the stacked semiconductor layer is etched by a reactive ion etching method using a gas containing hydrogen iodide (HI) or a gas containing chlorine.

8. A method for manufacturing an optical semiconductor device, comprising:
   a step of forming a stacked semiconductor layer on a substrate, the stacked semiconductor layer including a plurality of semiconductor layers;
   a step of forming a mask on a top layer of the stacked semiconductor layer, the mask covering a portion of the top layer;
   an exposing step of exposing the top layer of the stacked semiconductor layer to an oxygen-containing atmosphere;
   after the exposing step, a reduced pressure step of maintaining the stacked semiconductor layer under reduced pressure;
   after the reduced pressure step, a heating step of heating the stacked semiconductor layer to a temperature of 250° C. or more; and
   after the heating step, a step of forming a semiconductor mesa in the stacked semiconductor layer, the semiconductor mesa being formed by etching the stacked semiconductor layer by a dry etching method using the mask, wherein
   the top layer of the plurality of semiconductor layers of the stacked semiconductor layer contains arsenic; and
   the stacked semiconductor layer is maintained under the reduced pressure between the reduced pressure step and the step of forming the semiconductor mesa.

* * * * *